US008565442B2

(12) United States Patent
Maeda et al.

(10) Patent No.: US 8,565,442 B2

(45) Date of Patent: Oct. 22, 2013

(54) NOISE REDUCTION DEVICE

(75) Inventors: Tsuyoshi Maeda, Osaka (JP); Masaaki Higashida, Osaka (JP); Toshihiro Ezaki, Osaka (JP); Yoshifumi Asao, Osaka (JP); Hiroyuki Kano, Osaka (JP)

(73) Assignee: Panasonic Corporation, Osaka (JP)

(*) Notice: Subject to any disclaimer, the term of this patent is extended or adjusted under 35 U.S.C. 154(b) by 899 days.

(21) Appl. No.: 12/501,732

(22) Filed: Jul. 13, 2009

(65) Prior Publication Data

US 2010/0014683 A1 Jan. 21, 2010

(30) Foreign Application Priority Data

Jul. 15, 2008 (JP) ................................ 2008-183477

(51) Int. Cl.
*H03B 29/00* (2006.01)

(52) U.S. Cl.
USPC ........................................ 381/71.1; 381/71.4

(58) Field of Classification Search
USPC ........... 381/71.1, 71.4, 71.6, 71.8, 71.14, 92; 244/1 N
See application file for complete search history.

(56) References Cited

U.S. PATENT DOCUMENTS 5,526,292 A * 6/1996 Hodgson et al. .............. 700/280
5,713,438 A * 2/1998 Rossetti et al. ............... 188/378

FOREIGN PATENT DOCUMENTS

JP 05-158485 A 6/1993
JP 05-281980 A 10/1993
JP 05-289676 A 11/1993
JP 07-020880 A 1/1995
JP 09-034472 A 2/1997

OTHER PUBLICATIONS

S. J. Elliott and P. A. Nelson, "Active noise control", IEEE Signal Processing Mag., vol. 10, pp. 12-35, 1993.*

* cited by examiner

*Primary Examiner* — Duc Nguyen
*Assistant Examiner* — Kile Blair
(74) *Attorney, Agent, or Firm* — Pearne & Gordon LLP

(57) ABSTRACT

A noise reduction device including a noise detection microphone including a high-frequency noise detection microphone and a low-frequency noise detection microphone for respectively detecting a high-frequency noise and a low-frequency noise generated from a noise source; a noise control unit for generating a control sound signal for cancelling a noise detected by the noise detection microphone in a control center of control space; and a loudspeaker for outputting a control sound based on the control sound signal from the noise controlling unit. The high-frequency noise microphone is disposed in a vicinity of a head portion of a user in a state in which directivity in an opposite direction with respect to the control center is added, and the low-frequency noise detection microphone is disposed outside of a sound-insulating wall.

7 Claims, 11 Drawing Sheets

NOISE REDUCTION DEVICE

BACKGROUND OF THE INVENTION

1. Field of the Invention

The present invention relates to a noise reduction device, and more particularly relates to a noise reduction device used in an enclosed structure such as an aircraft and a railroad vehicle.

2. Background Art

In an aircraft, a railroad vehicle, and the like, having a loud noise, when information provision such as announcement service to passengers sitting in seats is carried out, noises at their seats are a problem.

Interior space such as an aircraft and a railroad vehicle whose boundary is made by a continuous wall is a kind of an enclosed structure. When such space includes a noise source inside and outside thereof, users are seated in an environment in which a noise is fixed. Therefore, depending on the degree of noise, the noise may be a factor of physical and mental pressure to users, thus reducing comfort for users. In particular, when such space is used as a cabin in an aircraft and services are provided to passengers in the space, the quality of services may be seriously affected.

In particular, main noise sources of an aircraft include a noise of devices such as a propeller and an engine for generating thrust of an aircraft, a noise associated with airflow, for example, a wind noise during flight, which is generated when a aircraft body moves in air space. Noises inside an aircraft make passengers uncomfortable and hinder announcement service, and the like, and therefore improvement is demanded.

In response to this, as measures to reduce noises in an enclosed room, conventionally, a method by a passive attenuator is generally employed. A noise insulation material having a sound-absorption property such as a barrier material and an absorption material is disposed between an enclosed structure and a noise generation source. An example of the barrier material includes a high-density barrier material, and an example of the absorbing material includes a sound-absorption sheet. A material having a sound-absorption property has generally high density and a high-density material increases weight. When the weight increases, a flight fuel is increased and thus flying range is reduced. Therefore, cost efficiency and function as an aircraft are caused to be reduced. Furthermore, in a structure material, deterioration in strength such as damageability and functional deterioration in design such as deterioration of feeling of quality are not negligible.

In order to address the above-mentioned problems of the noise-reduction measure by a passive attenuator, as a method for reducing a noise by an active attenuator, a method for generating an acoustic wave having the phase opposite to the phase of a noise is generally carried out conventionally. With this method, a noise level in the noise generating source or the vicinity thereof can be reduced, and a noise can be prevented from propagating to a region that needs reduction of noise. Specifically, a sound cancellation device including a microphone for detecting a sound emitted from a noise source, a controller for amplifying an electrical signal input from the microphone and reversing the phase; and a loudspeaker for converting the electrical signal input from the controller into a sound and transmitting the sound is proposed.

In an aircraft and the like, based on the method for reducing a noise with the active attenuator mentioned above, noise-reduction measure is carried out from the viewpoint of improving comfort of a passenger seat. For example, a method for placing a noise-reduction device in every seat, and installing a loudspeaker, a microphone and a controller in the vicinity of the seat; and a method for reducing a noise in space by disposing a plurality of loudspeakers and microphones in the vicinity of a user sitting in a seat have been proposed (see, for example, patent documents 1 and 2).

Furthermore, in an aircraft and the like, in order to provide service in which comfort in a seat is enhanced, shell-structured seats each of which is surrounded by a structure are provided in a part of a cabin, and the seats are partitioned from each other by a structure, so that a noise entering from the surrounding of the seat is suppressed.

As an example of a method for enhancing the effect of suppressing a noise by using both a structure and a noise reducing device, a technology about a position relation between a sound-insulating wall and a noise detection unit is conventionally disclosed (see, for example, patent documents 3 to 5).

However, in service providing a high comfort, for example, a shell-structured passenger seat in an aircraft, high quality as to the noise level of the seat is also demanded. An aircraft in which many seats and devices are placed has a very complicated noise environment, so that the noise reduction devices installed at the seats are required to have a performance and quality corresponding to such a noise environment. In an aircraft, various noise sources from low frequency to high frequency are present. When a noise detection microphone picks up voices emitted from passengers of the aircraft and noises emitted from devices to be used, such noises become a noisy sound, so that a sufficient noise reduction effect cannot be obtained. To such problems, a conventional technology has paid attention to the relation between a noise detection microphone and an error microphone for detecting a remaining noise at a control point in space that is divided into two by a structure as a boundary for reducing a noise. However, a method for disposing the noise microphone in the above-mentioned two spaces has not been considered. Therefore, there is a problem that a conventional technology is used as a technology for realizing a high quality effect of reducing noises in particular place like seats in an aircraft and the like.

[Patent document 1] Japanese Patent Unexamined Publication No. H5-289676

[Patent document 2] Japanese Patent Unexamined Publication No. H5-281980

[Patent document 3] Japanese Patent Unexamined Publication No. H9-034472

[Patent document 4] Japanese Patent Unexamined Publication No. H7-020880

[Patent document 5] Japanese Patent Unexamined Publication No. H5-158485

SUMMARY OF THE INVENTION

A noise reduction device of the present invention includes a noise detection unit including a high-frequency noise detection unit and a low-frequency noise detection unit for respectively detecting a high-frequency noise and a low-frequency noise generated from a noise source; a noise controlling unit for generating a control sound signal for cancelling a noise detected by the noise detection unit in a control center of control space; and a control sound outputting unit for outputting a control sound based on the control sound signal from the noise controlling unit. The high-frequency noise detection unit is disposed in a vicinity of the control center in a state in which directivity in an opposite direction with respect to the control center is added. The low-frequency noise detection unit is disposed in a position in which a sound emitted from the vicinity of the control center is attenuated to a predetermined level.

With such a configuration, a noise emitted from the low-frequency noise source and the high-frequency noise source are effectively detected and a noisy sound adversely affecting a noise such as a voice emitted from a user is not picked out. Therefore, a noise reaching from the surrounding can be reliably reduced. Thus, it is possible to realize a noise reduction device having high quality and high convenience to a plurality of noise sources and their noise conditions, in the control center of the control space.

DETAILED DESCRIPTION OF THE INVENTION

Hereinafter, an embodiment of the present invention is described with reference to FIGS. 1 to 10.

Embodiment

Hereinafter, a noise reduction device in accordance with an embodiment of the present invention is described taken a case where it is mounted on an aircraft as an example.

Firstly, a sound environment of an aircraft in which a noise reduction device is required to be installed is described with reference to FIGS. 1 and 2.

Figure 1:
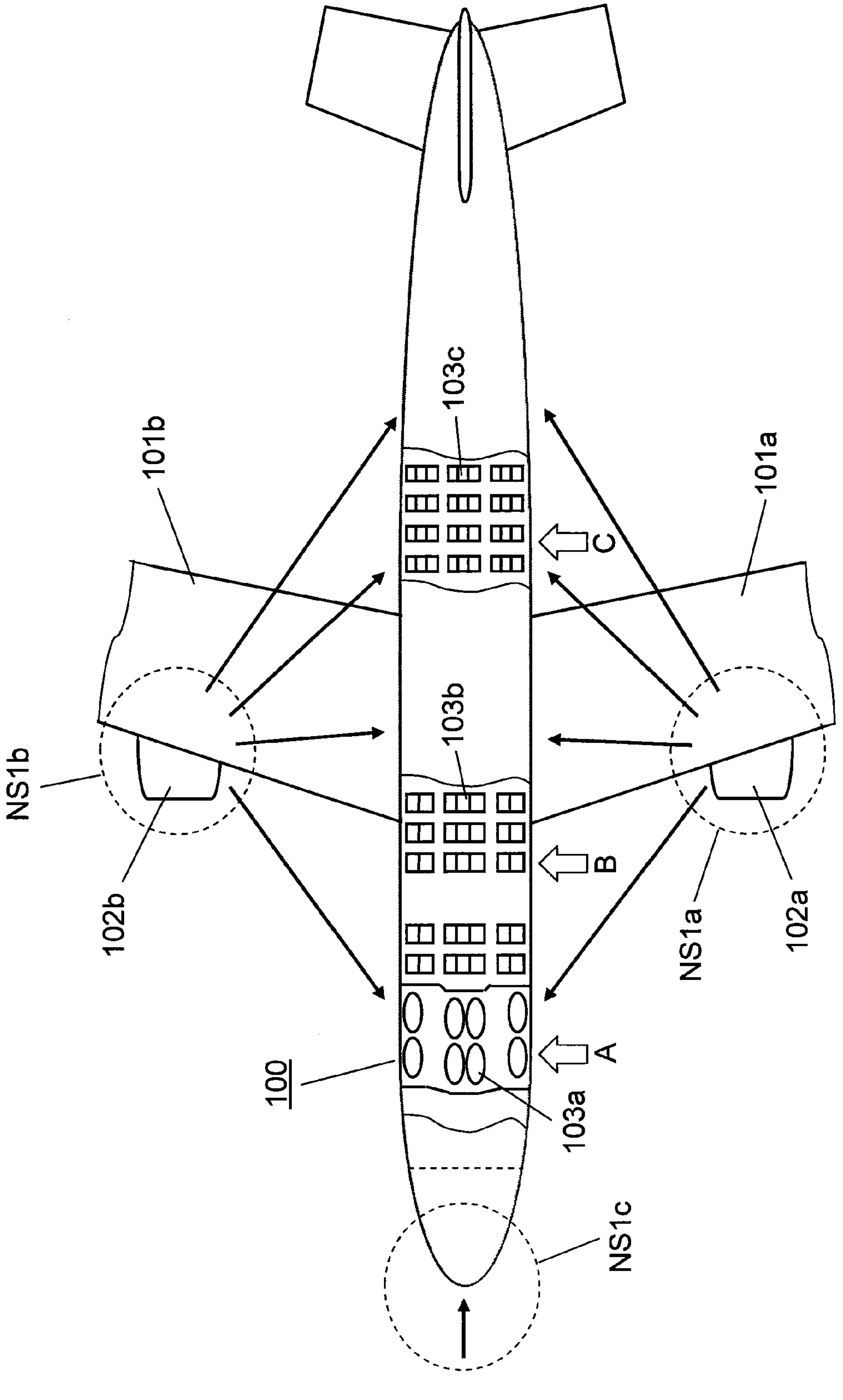
FIG. 1 is a plan view showing an environment in which a noise reduction device is installed in accordance with an embodiment of the present invention.

FIG. 1 is a plan view showing an environment in which a noise reduction device is installed in accordance with an embodiment of the present invention. As shown in FIG. 1, aircraft 100 includes engines 102*a* and 102*b* on left and right wings 101*a* and 101*b*.

From the viewpoint of a sound environment of an aircraft, an engine occupies an important position as a noise source because it has not only a rotating sound but also reverberation of airflow during flight. From the viewpoint of service for users, engines 102*a* and 102*b* as outside noise sources NS1*a* and NS1*b* act on each part of the aircraft body, that is, rows of seats 103*a*, 103*b* and 103*c* installed in, for example, cabin A (for example, first class), cabin B (for example, business class) and cabin C (for example, economy class) in the aircraft. In addition, a collision noise (wind noise) between the tip portion of the body of the aircraft and the airflow as noise source NS1*c*, which is generated when the aircraft body moves at high speed in the air space, has an adverse effect on information provision service inside the aircraft.

Figure 2:
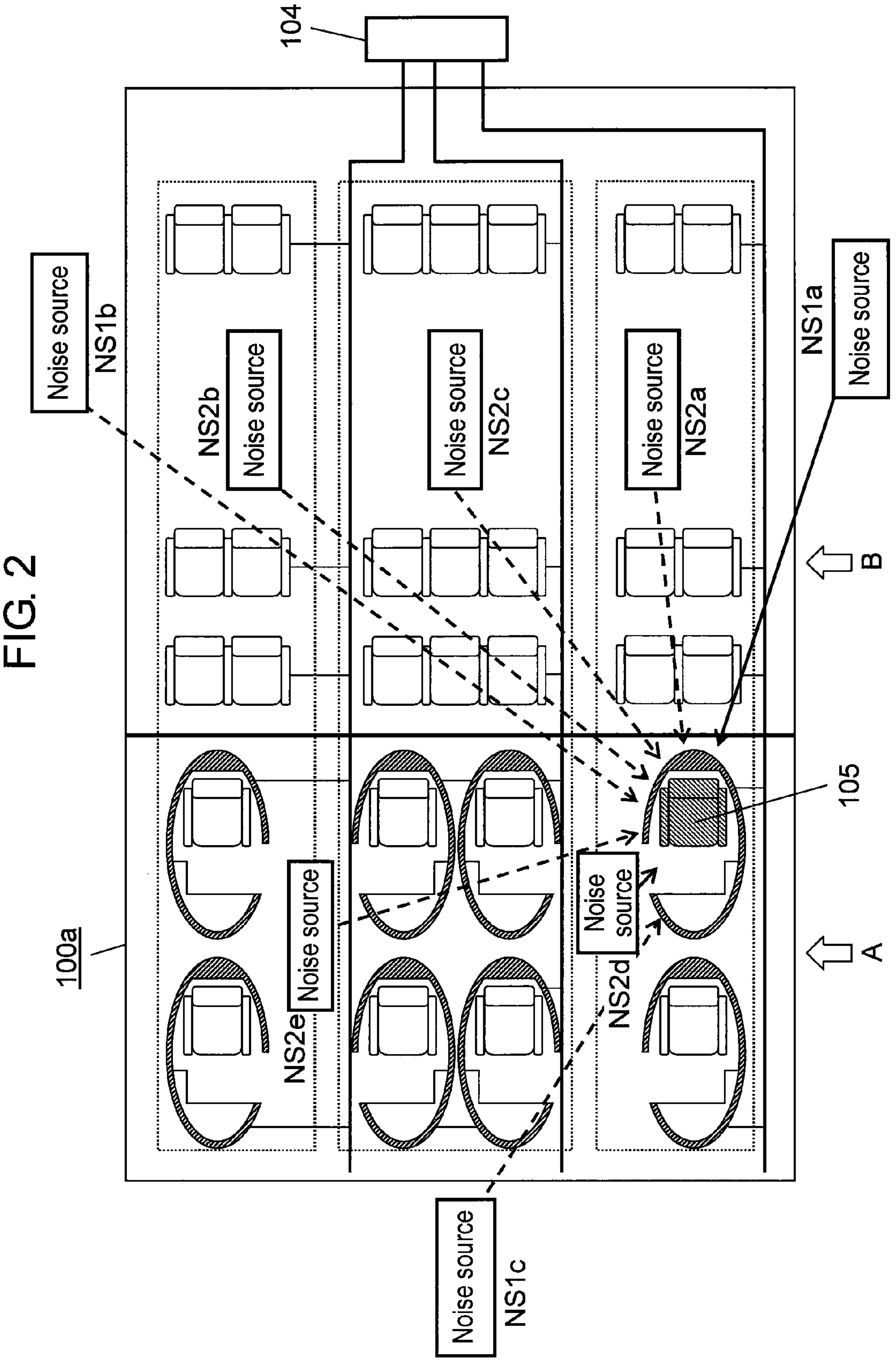
FIG. 2 is a plan view showing a detail of the environment in which the noise reduction device is installed in accordance with the embodiment of the present invention.

FIG. 2 is a plan view showing a detail of the environment in which the noise reduction device is installed and enlarging the arrangement of seats in a part of cabin A and cabin B shown in FIG. 1. Cabin 100*a* is divided into cabin A and cabin B by a wall. Cabin A and cabin B include rows of seats, respectively. Furthermore, each seat row is provided with audio-visual equipment and the like connected to system management device 104 including a switching device, a data management server, and the like, via a communication line such as Ethernet (registered trademark).

Meanwhile, as a sound environment of cabin 100*a*, noise sources NS1*a* and NS1*b* generated from engines 102*a* and 102*b* and wind noise NS1*c* at the tip portion of the aircraft body are present as the outside noise sources. In addition, noise sources NS2*a* to NS2*e* caused by, for example, an air-conditioner are present as the inside noise sources. When this is thought as a noise in seat 105 that is one of the seats arranged in cabin A, seat 105 is affected by noise sources NS1*a* to NS1*c* caused by engine 102*a* (FIG. 1) mounted on the wing outside the window and an airflow noise and noise sources NS2*a* to NS2*e* caused by an air-conditioner. For example, in seat 105 in cabin A, it is expected that a noise from noise source NS1*a* caused by an engine mounted on a left wing (FIG. 1) is strongest among noises coming from noise sources NS1*a* to NS1*c* and noise sources NS2*a* to NS2*e*. Therefore, in order to reduce noises effectively in each seat, it is necessary to emphatically cope with a noise, which is the loudest and has the most adverse effect on the sound environment of a seat among noises generated from various directions, for a user sitting in the seat.

In particular, in, for example, a first class shown by cabin A in FIG. 1, a seat has a shell structure. Inside of this shell, audio-visual devices such as television and radio for enjoying movies and music, a desk, an electric power for connecting PC, and the like, for a business person are placed. Thus, it is strongly demanded to provide a user with an environment in which the user can feel relaxed, or concentrate on business. Therefore, demand for noise reduction inside this shell is particularly large.

Next, a basic configuration of the noise reduction device in accordance with the embodiment of the present invention is described with reference to FIG. 3.

Figure 3B:
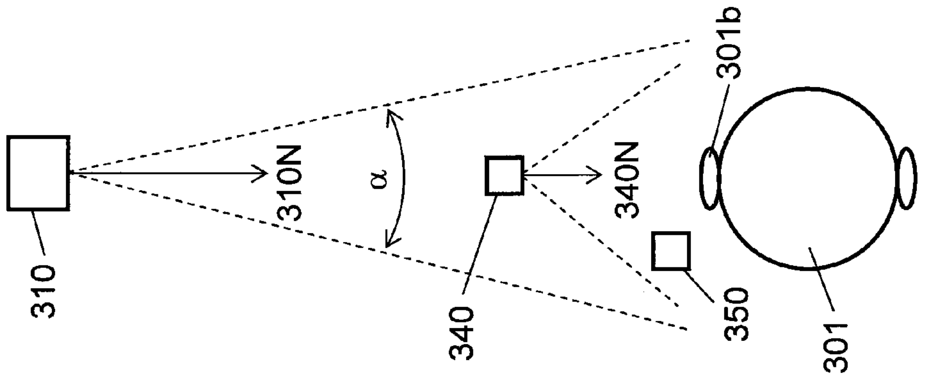
FIG. 3B is a view showing a method for superimposing a control sound output from a loudspeaker and a noise emitted from a noise source to each other in accordance with the embodiment of the present invention.
Figure 3A:
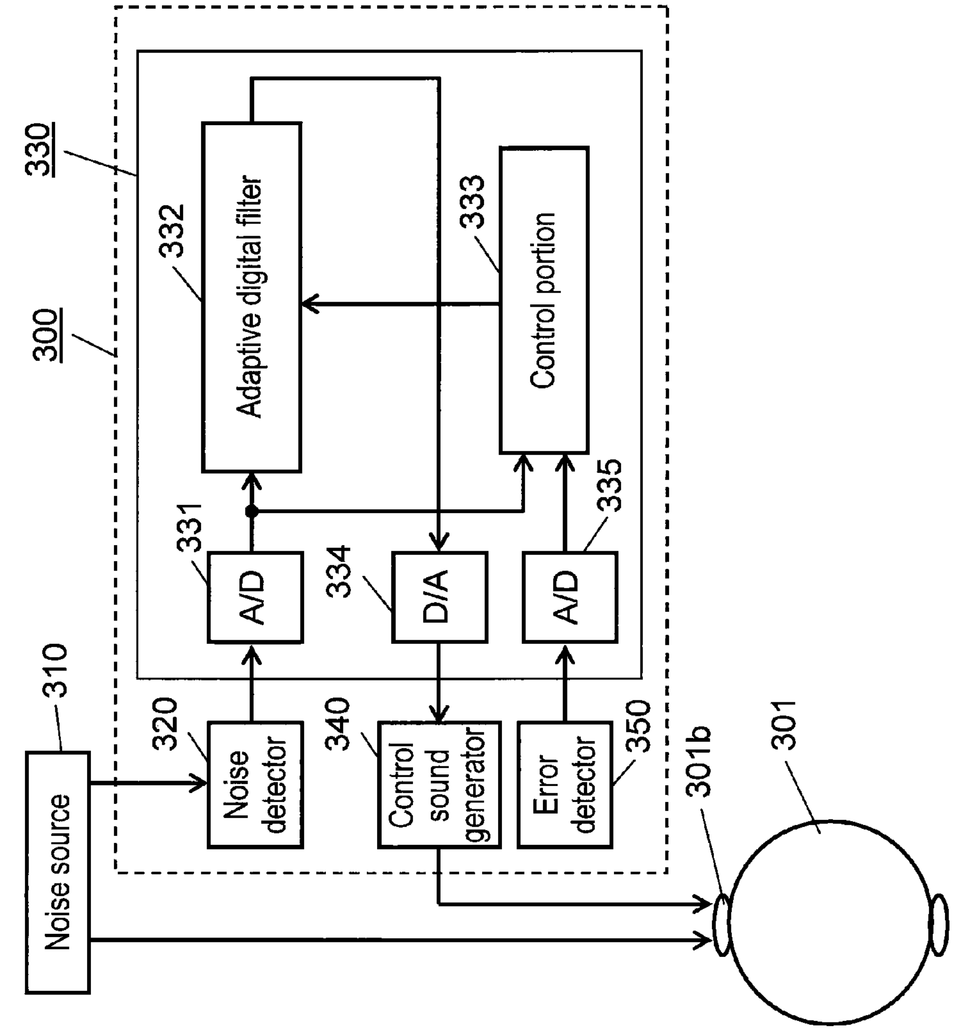
FIG. 3A is a block diagram showing a basic configuration of the noise reduction device in accordance with the embodiment of the present invention.

FIG. 3A is a block diagram showing a basic configuration of a noise reduction device.

Noise reduction device 300 includes noise detector 320, noise controller 330, control sound generator 340 and error detector 350. Hereinafter, respective configurations and functions are described.

Noise detector 320 is provided as a noise detection unit for detecting a noise emitted from noise source 310 and is a microphone having a function of detecting noise information, converting it into an electrical signal and outputting the electrical signal.

Noise controller 330 as a noise controlling unit includes A/D converters 331 and 335, adaptive digital filter 332, control part 333, and D/A converter 334. It generates a control sound signal so that a detection error is minimized based on the noise information from noise source microphone 320 as a noise detection unit and error information of error detector 350, thus controlling control sound generator 340.

A/D converter 331 A/D converts a noise signal from noise source microphone 320 and outputs the converted signal to adaptive digital filter 332 and control part 333. Adaptive digital filter 332 includes a multi-stage tap and is an FIR filter capable of freely setting a filter coefficient of each tap. Detection error information from error detector 350 in addition to information from noise source microphone 320 is input to control part 333 via A/D converter 335. Each filter coefficient of adaptive digital filter 332 mentioned above is adjusted so that this detection error is minimized. That is to say, a control sound signal having a phase opposite to the phase of the noise from noise source 310 is generated in a position in which error detector 350 is installed, and the generated signal is output to a control sound generator via D/A converter 334. Control sound generator 340 is a loudspeaker as a control sound output unit and can convert the control sound signal received from D/A converter 334 into an acoustic wave and output it and has a function capable of generating a control sound that offsets a noise in the vicinity of ear 301*b* of user 301. Error detector 350 as an error sound detection unit detects a sound whose noise is reduced and feeds it back to the operation results of noise reduction device 300. Thus, even when the noise environment and the like are changed, a noise can be always minimized at the position of the ear of a user.

As shown in FIG. 3A, noise reduction device 300 in accordance with the embodiment of the present invention detects a noise emitted from noise source 310 by noise source microphone 320, subjects the detected noise to signal processing in noise controller 330, and outputs a control sound from loudspeaker 340. Then, a noise emitted from noise source 310 and a sound having a reversed phase thereto are superimposed to each other, which is transmitted to ear 301*b* of user 301. Thus, noise reduction is carried out.

FIG. 3B shows a method for superimposing a control sound output from loudspeaker 340 and a noise emitted from noise source 310 to each other.

When a noise-spreading angle with respect to main arrival route 310N of a noise, which links between noise source 310 and ear 301*b* of user 301 is $\alpha$, loudspeaker 340 is disposed within the spreading angle $\alpha$. Thus, a control sound having reversed phase emitted from loudspeaker 340 is superimposed to a noise, which reaches ear 301*b* of user 301. Furthermore, by disposing error microphone 350 as an error detector in the superimposed region, a sound whose noise is reduced is detected as an error, and fed back to the operation result of noise reduction device 300. Thus, a noise reduction effect can be enhanced.

Figure 4:
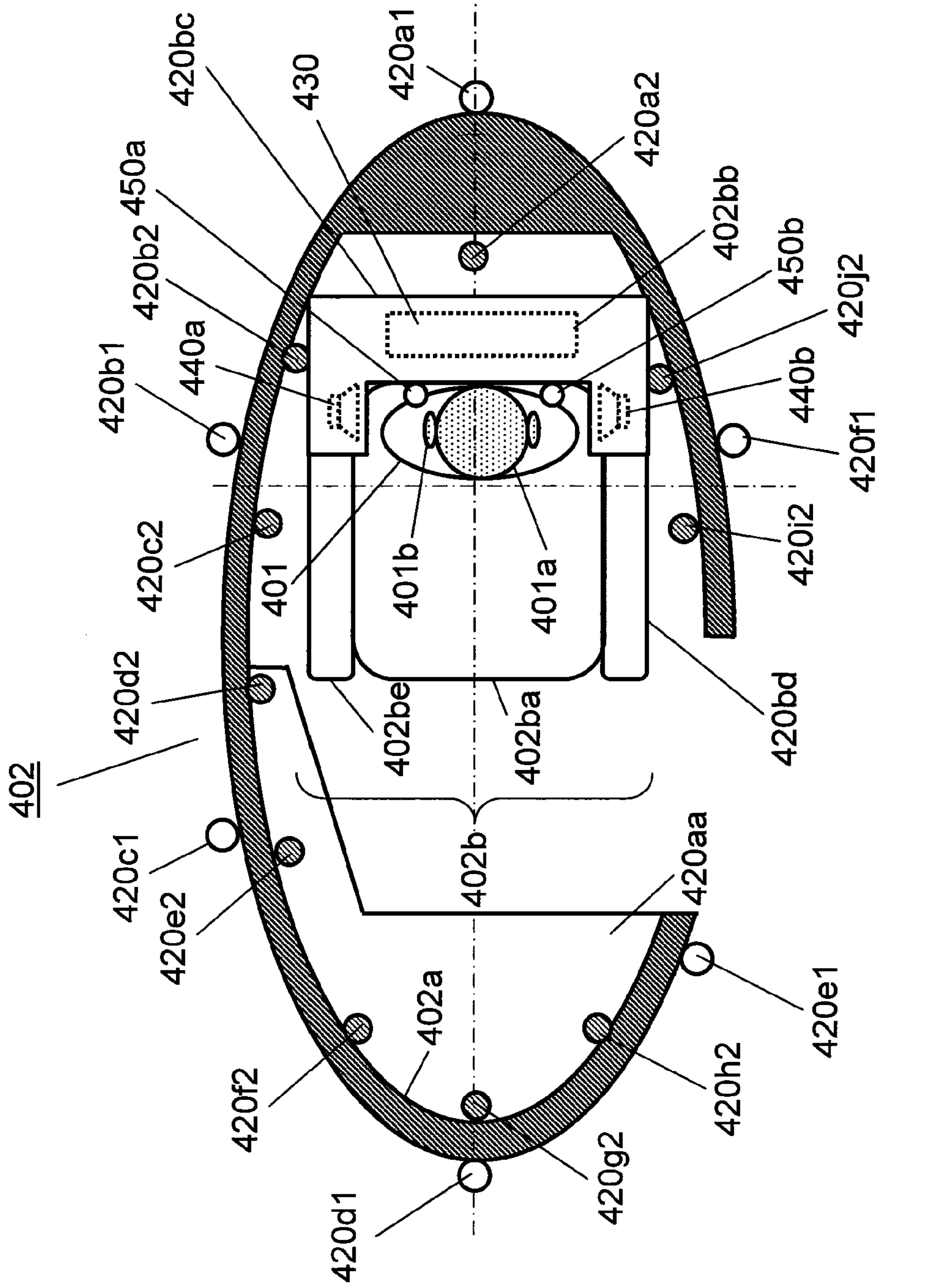
FIG. 4 is a plan view showing a configuration of an example in which the noise reduction device is installed in accordance with the embodiment of the present invention.

Next, a configuration feature of a case in which a noise reduction device in accordance with the embodiment of the present invention (hereinafter, abbreviated as “this device”) is installed in a cabin of an aircraft is described with reference to FIG. 4. FIG. 4 is a plan view showing a main configuration of an example of a noise reduction device installed in a cabin of an aircraft.

As shown in FIG. 4, this device is installed in seat 402, which is control space for controlling a noise and arranged in cabin A (FIG. 1) of an aircraft.

Seat 402 has shell portion 402*a* securing a user’s occupied area surrounded by a wall surface in a shell form and seat portion 402*b* disposed inside shell portion 402*a*. Shell portion 402*a* has shelf portion 402*aa*, which can function as a desk, in a position facing the front part of seat portion 402*b*. Furthermore, seat portion 402*b* includes a backrest (not shown), headrest 402*bc* and armrests 402*bd* and 402*be*.

A sound environment in cabin A of an aircraft includes a noise source including engine mounted on an aircraft body, an air conditioner placed inside the cabin, and the like. In seat 402, noises emitted from the noise sources reach an outer peripheral portion of shell portion 402*a*. Noises from various noise sources include a noise with a low frequency of several tens Hz to a noise with a high frequency of several KHz. Herein, a noise in a relatively low frequency band is referred to as a low-frequency noise and a noise in a higher frequency band than the low-frequency noise is referred to as a high-frequency noise. A microphone for mainly detecting the above-mentioned low-frequency noise is defined as a low-frequency noise detection microphone and a microphone for mainly detecting the above-mentioned high-frequency noise is defined as a high-frequency noise detection microphone. The boundary frequency fc between the low-frequency noise and the high-frequency noise is, for example, 500 Hz. To the above-mentioned noise reaching the peripheral portion of shell portion 402*a*, for example, six low-frequency noise detection microphones 420*a*1-420*f*1 and ten high-frequency noise detection microphones 420*a*2-420*j*2 are placed outside (noise source side) and inside (user side) with shell portion 402*a* of seat 402 sandwiched therebetween.

In this way, the number of high-frequency noise detection microphones is made to be larger than that of the low-frequency noise detection microphones. Thus, it is possible to precisely detect a high frequency noise whose wavelength is shorter than that of a low-frequency noise and to reduce the number of low-frequency noise detection microphones. Consequently, a noise reduction device with a smaller size and a lower cost can be realized. The above-mentioned boundary frequency fc is different depending upon the noise environment of the surrounding in which this device is installed or installing condition, and a suitable frequency can be set if necessary.

Furthermore, headrest 402*bc* has a C-letter shape. When user 401 sits in seat 402, head portion 401*a* is surrounded by headrest 402*bc*. Furthermore, noise controller 430 and loudspeakers 440*a* and 440*b* are embedded in headrest 402*bc*. Loudspeakers 440*a* and 440*b* are disposed to head portion 401*a* of user 401 so as to face ear 401*b*. Furthermore, microphones 450*a* and 450*b* as error detectors are disposed between head portion 401*a* and loudspeakers 440*a* and 440*b*, respectively.

Figure 5A:
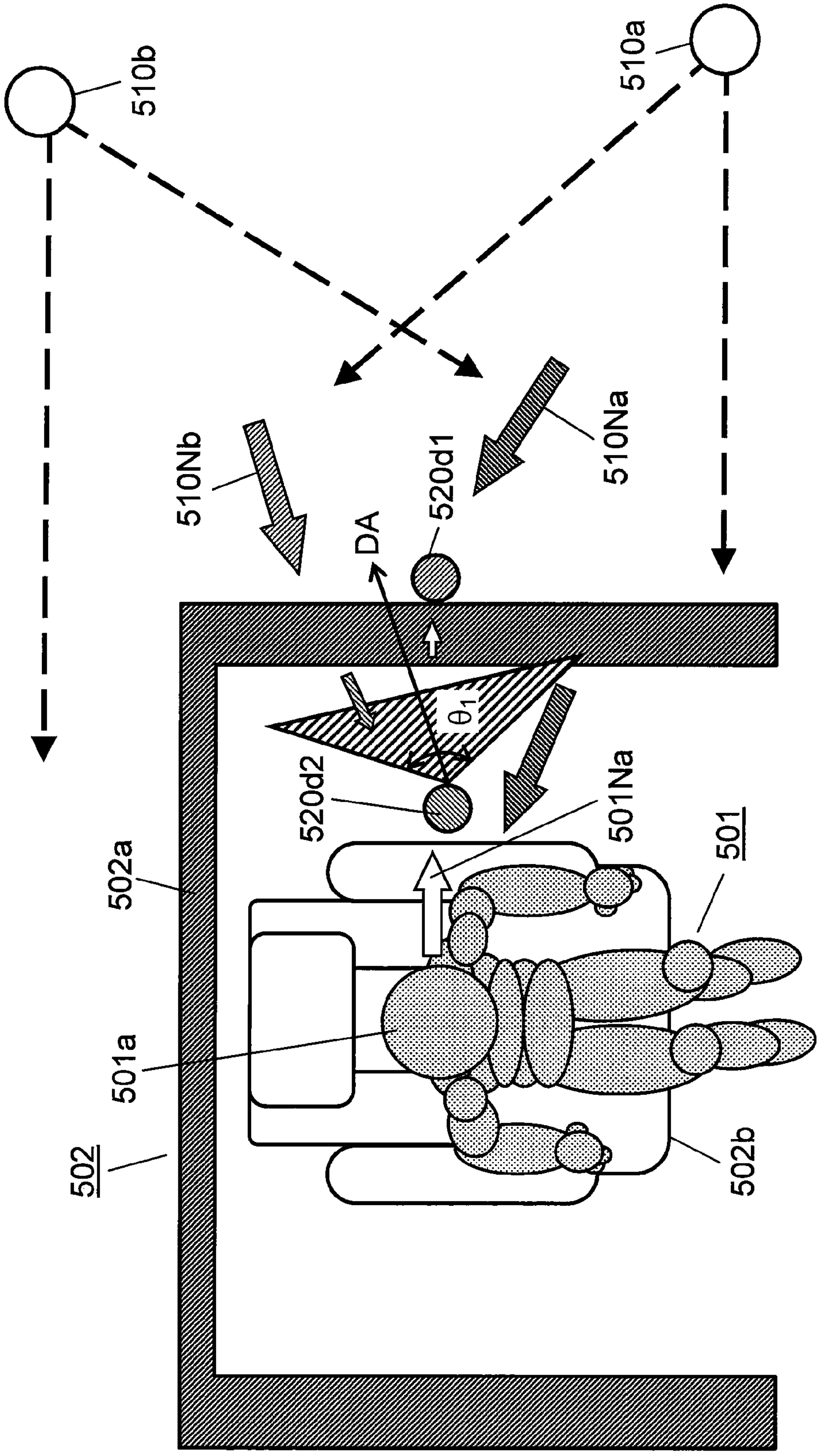
FIG. 5A is a plan view showing an arrangement of principle components in an example in which the noise reduction device is installed in accordance with the embodiment of the present invention.
Figure 5B:
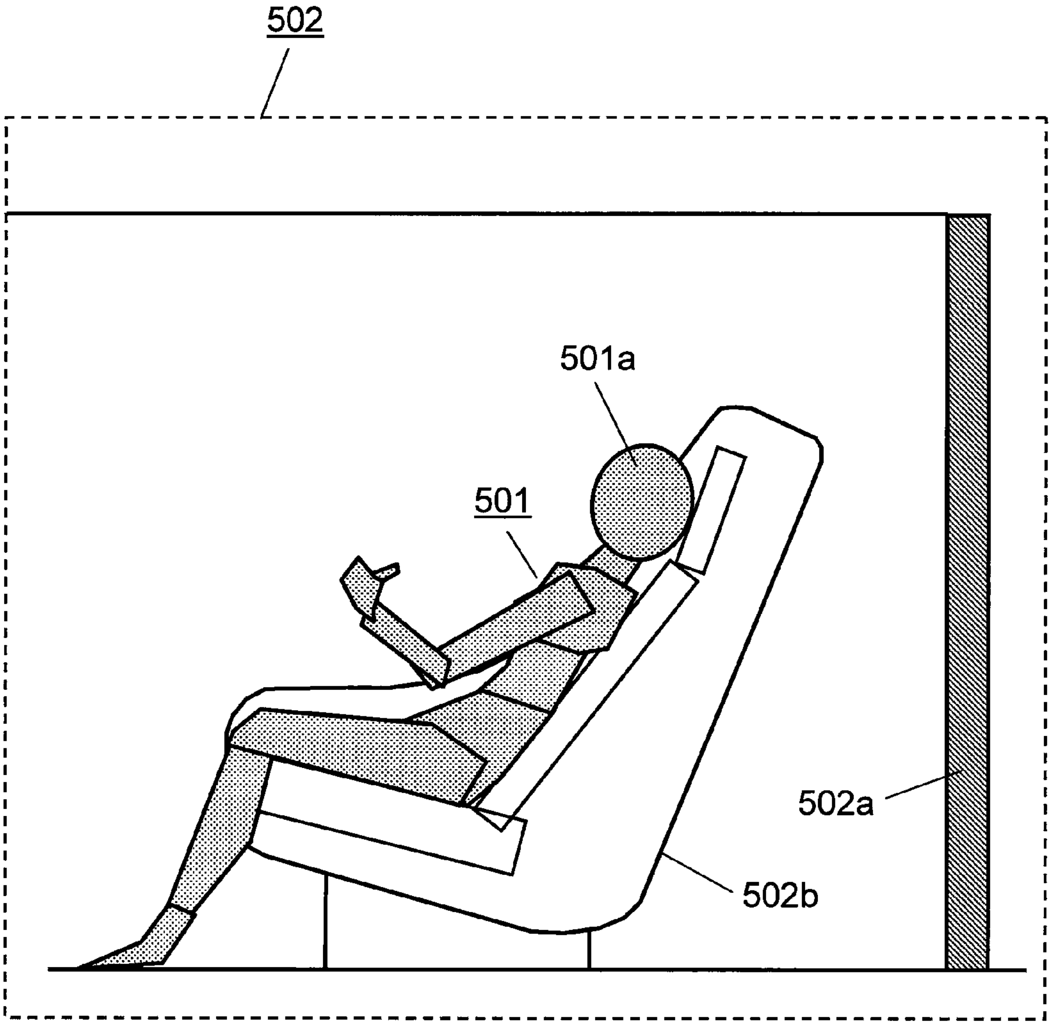
FIG. 5B is a side view showing an arrangement of principle components in an example in which the noise reduction device is installed in accordance with the embodiment of the present invention.

Next, a method for detecting a noise by a noise reduction device, which is a configuration feature of this device is described with reference to FIGS. 5A and 5B. FIGS. 5A and 5B are views schematically showing an example of an arrangement of principle components of seat 502 provided with this device. FIG. 5A is a plan view, and FIG. 5B is a side view. In this device, a seat inside shell portion 502*a* is defined as control space, and a position of the head position of a user sitting in the seat is defined as a control center that is a center of control space.

In FIGS. 5A and B, seat 502 includes shell portion 502*a* as a structure for partitioning seat 502 and seat portion 502*b*. Seat portion 502*b* is held by shell portion 502*a* partitioning from the other seat in a state in which the surrounding is enclosed by a wall surface.

In seat 502, physical sound isolation is carried out in the surrounding of seat 502 by shell portion 502*a* with respect to, for example, noises emitted from noise source 510*a* of a low-frequency noise and noise source 510*b* of a high-frequency noise outside. Noises from noise sources 510*a* and 510*b* enter the inside of shell portion 502*a* through main arrival routes (noise routes) 510Na and 510Nb, respectively, and reach head portion (ear) 501*a* of user 501 sitting in seat portion 502*b*. When various noise sources are present as in an aircraft and when a main noise route cannot be specified, it is effective that a noise detection microphone is disposed inside sound-insulating wall 502*a* from the viewpoint of detecting a noise. However, when the noise detection microphone is disposed inside sound-insulating wall 502*a*, the microphone picks up voices of a user or a sound emitted from a device to be used (hereinafter, referred to as "user's sound"), and this sound becomes a noisy sound and adversely affects a noise reduction operation.

In general, with respect to a sound with high frequency, it is relatively easy to provide a microphone with directivity. By providing directivity in the opposite direction with respect to a user, the above-mentioned problems can be solved. On the other hand, since a sound with low frequency has long wavelength, when directivity is provided, a device inevitably becomes larger. Therefore, it is difficult to realize it in an aircraft, and the like.

By the way, as to the low-frequency noise, correlation between the inside and the outside of sound-insulating wall 502*a* is high. Thus, from a level of a noise detected by a microphone disposed outside of sound-insulating wall 502*a*, a noise level inside sound-insulating wall 502*a*, that is, in the control space can be estimated considerably exactly. Furthermore, by disposing a noise detection microphone outside of sound-insulating wall 502*a*, the microphone does not pick up the above-mentioned user's sound as a noisy sound.

In this way, as a noise detection microphone, two kinds of microphones, a microphone for high frequency and a microphone for low frequency are used and they are disposed inside and outside of sound-insulating wall 502*a*, separately. Thereby, noise detection in the control space can be carried out with high accuracy.

Arrangement of noise detection microphones of this device and the operation thereof are described in detail with reference to FIGS. 5A and 5B.

In this device, in a position in which a noise detection microphone in the periphery of shell portion 502*a* is installed, low-frequency noise detection microphone 520*d*1 as a low-frequency noise detection unit and high-frequency noise detection microphone 520*d*2 as a high-frequency noise detection unit are placed with sound-insulating wall 502*a* sandwiched therebetween. That is to say, low-frequency noise detection microphone 520*d*1 is disposed outside of sound-insulating wall 502*a* in the vicinity of sound-insulating wall 502*a*. High-frequency noise detection microphone 520*d*2 is disposed in the vicinity of head portion 501*a* of user 501 as a control center inside of sound-insulating wall 502*a*. Furthermore, the direction of directivity DA and directivity angle $\theta_1$ of high-frequency noise detection microphone 520*d*2 are set with respect to high-frequency noise source 510*b*. High-frequency noise detection microphone 520*d*2 detects a high-frequency noise from noise source 510*b* accurately and reliably without picking up user's sound 501Na. Therefore, noise reduction can be carried out effectively. Herein, when high-frequency noise detection microphone 520*d*2 provided with directivity is employed, the detection sensitivity of user's sound 501Na is reduced by about 10 dB as compared with a microphone with which the directivity is not provided. This 10 dB is just an example and the value is not necessarily limited to this value. This value may be varied depending upon a noise environment or installing conditions of the surrounding in which this device is installed.

On the other hand, the low-frequency noise detection microphone 520*d*1 is directed to noise source 510*a* of a low-frequency noise and is not provided with directivity. However, microphone 520*d*1 is disposed outside of sound-insulating wall 502*a*. Therefore, user's sound 501Na is attenuated by sound-insulating wall 502*a* and low-frequency noise detection microphone 520*d*1 does not pick up user's sound 501Na. Therefore, this microphone can also carry out noise reduction effectively.

In this way, in this device, the microphone for detecting a high-frequency noise is disposed inside of sound-insulating wall 502*a* in a state in which the directivity of the microphone is directed in the opposite direction with respect to a user, and the microphone for detecting a low-frequency noise is disposed outside of sound-insulating wall 502*a*. Thereby, a high-frequency noise and a low-frequency noise can be detected separately without picking up user's sounds with high accuracy. Thus, it is possible to effectively reduce high-frequency noises and low-frequency noises reaching user 501 sitting in seat 502.

Furthermore, since user's sounds can be attenuated effectively by providing sound-insulating wall 502*a*, a low-frequency noise detection microphone can be disposed in a position closer to the control space, enabling a compact noise reduction device to be configured.

For high-frequency noise detection microphone 520*d*2, a microphone whose directivity can be changed may be used and the direction of directivity from each microphone may be appropriately changed according to the condition of noise emitted from the noise source. When a plurality of noise sources that are subjects of noise reduction are present, the number and frequency of noise sources as the subjects are specified based on the detection information from the placed microphones, and the direction of the directivity of microphones may be set with respect to the specified noise source separately.

Furthermore, the directivity of a microphone can be realized by using an array microphone in which a plurality of microphone elements are disposed in an array form and by adjusting the distance between microphone elements. Furthermore, by changing the width of the array microphone, the frequency characteristic of the directivity can be adjusted.

In the above description, a case in which a high-frequency noise source and a low-frequency noise source are present separately is described. Even in a case where one noise source emits noises in a wide frequency range from low frequency to high frequency, noises can be separately detected by the above-mentioned two kinds of microphones.

Next, other application examples of the embodiment of the present invention are described with reference to FIGS. 6 to 8.

In FIGS. 5A and 5B, low frequency components of user's sound 501Na are attenuated by using sound-insulating wall 502*a* and prevented from being picked up by low-frequency noise detection microphone 520*d*1. However, even when sound-insulating wall 502*a* is not provided, by disposing low-frequency noise detection microphone 520*d*1 distant from a user, measure is possible.

Figure 6:
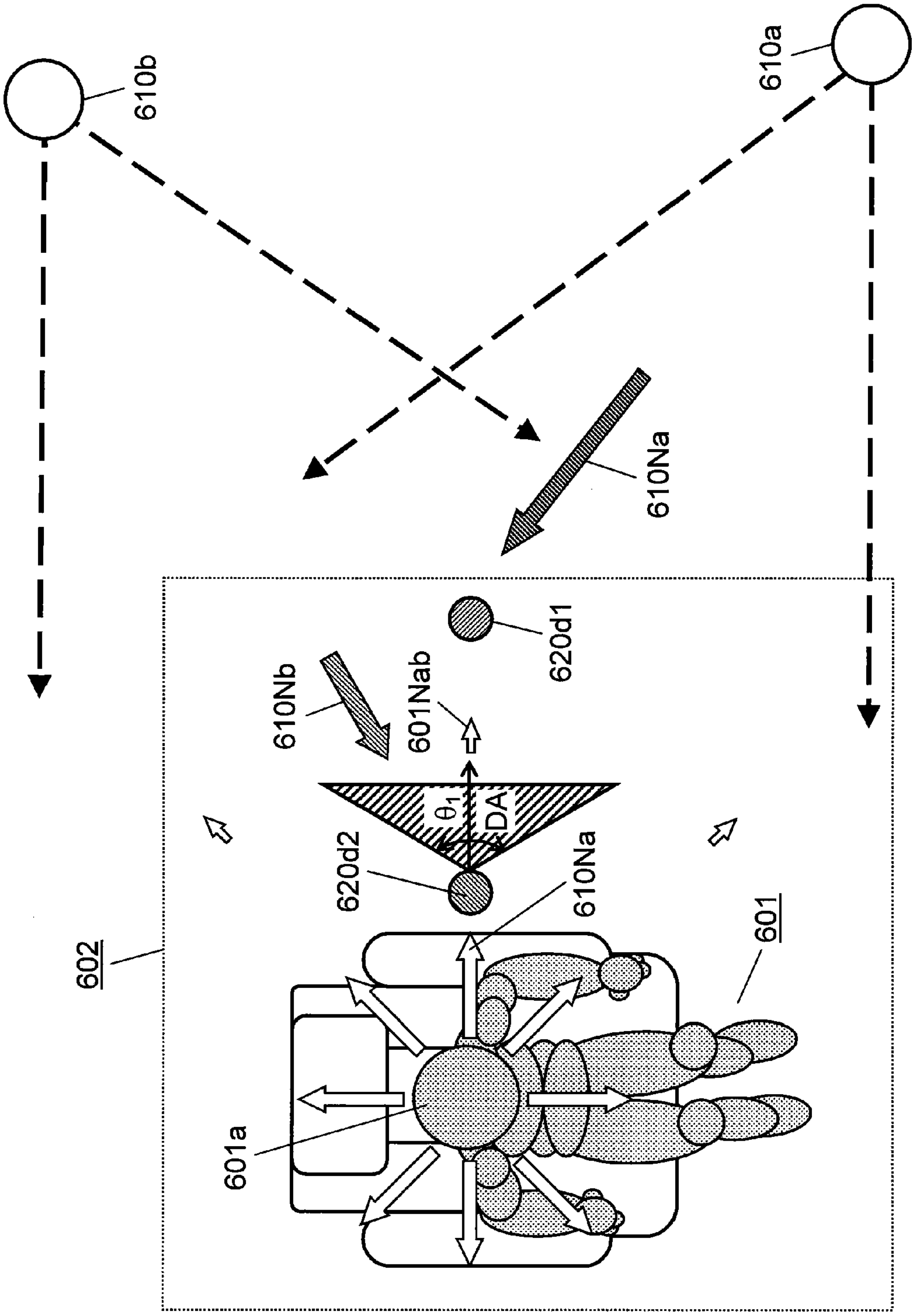
FIG. 6 is a view showing a first application example of an arrangement of a noise detection microphone of the noise reduction device in accordance with the embodiment of the present invention.
Figure 7:
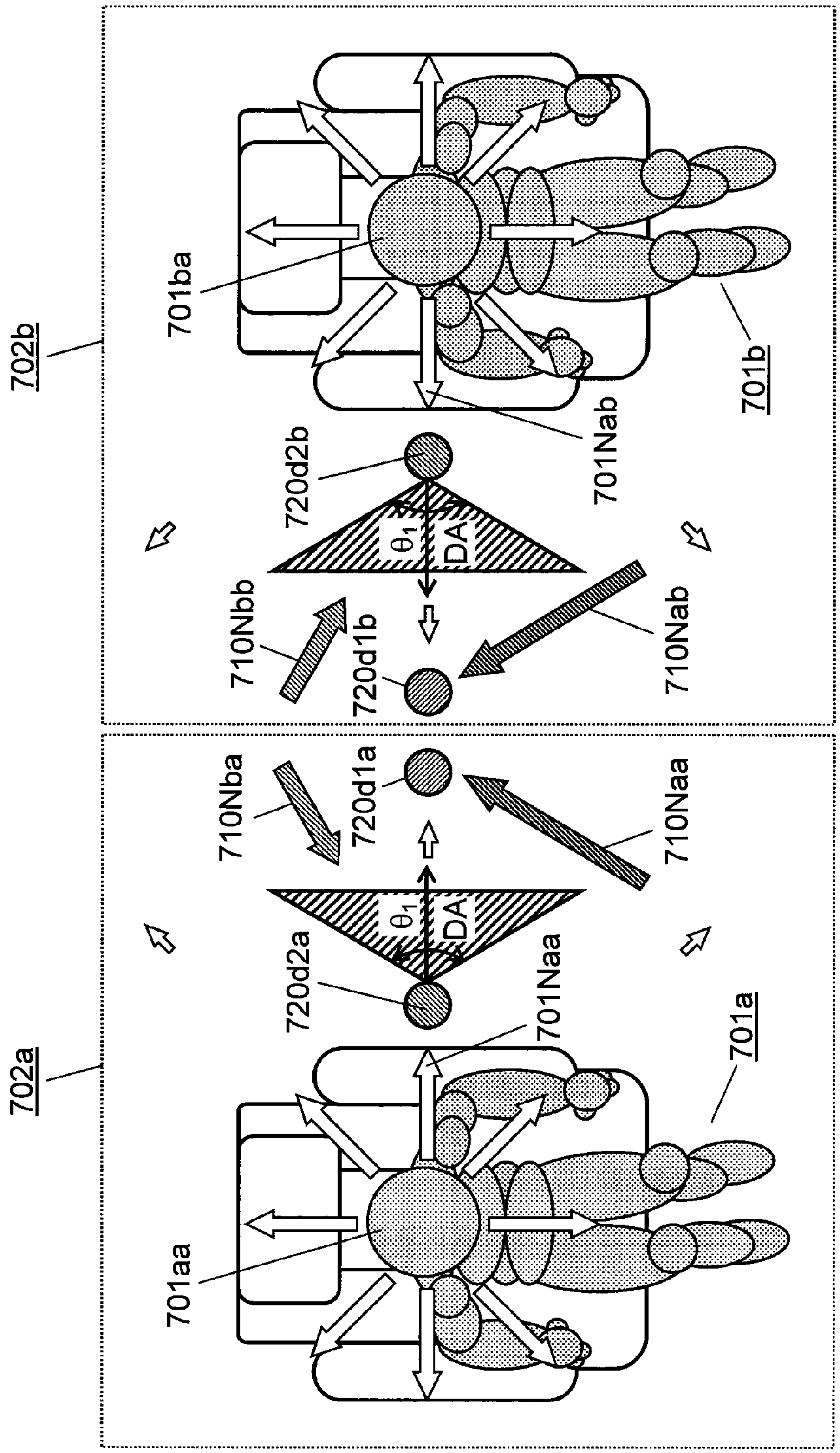
FIG. 7 is a view showing a second application example of an arrangement of a noise detection microphone of the noise reduction device in accordance with the embodiment of the present invention.

FIG. 6 is a view showing a first application example of an arrangement of a noise detection microphone of this device. The first application example is characterized in that a seat as control space does not have a sound-insulating wall and, instead, a low-frequency noise detection microphone is disposed in a position distant from a control center.

In FIG. 6, high-frequency noise detection microphone 620*d*2 is disposed in the vicinity of control center 601*a* in a state in which directivity DA in the opposite direction with respect to control center 601*a* is provided and detects a high-frequency noise reaching from noise source 610*b* through main arrival route 610Nb. Since high-frequency noise detection microphone 620*d*2 has directivity in the opposite direction with respect to control center 601*a*, it does not pick up user's sound 601Na emitted from control center 601*a*.

On the other hand, low-frequency noise detection microphone 620*d*1 that does not have the directivity is disposed in a position apart from control center 601*a* by a predetermined distance and detects a low-frequency noise reaching from noise source 610*a* through main arrival route 610Na. Since low-frequency noise detection microphone 620*d*1 is disposed in a position distant from control center 601*a*, user's sound 601Nb is attenuated to a predetermined level until it reaches low-frequency noise detection microphone 620*d*1. This also does not pick up user's sound 601Nb as a noisy sound.

Thus, high-frequency noise detection microphone 620*d*2 and low-frequency noise detection microphone 620*d*1 can detect noises emitted from noise source 610*a* of low-frequency noise and noise source 610*b* of high-frequency noise effectively without detecting user's sound 601Na and 601Nab as a noisy sound. Therefore, an effect of realizing a high-quality noise reduction can be exhibited without being adversely affected by a user's sound generated inside control space.

Next, a second application example of the embodiment of the present invention is described. FIG. 7 is a view showing a second application example of an arrangement of a noise detection microphone of this device.

This example shows a case in which two seats 702*a* and 702*b* are adjacent to each other. Each seat has the same configuration as that shown in FIG. 6. User's sound 701Naa is propagated to the surrounding from head portion 701*aa* of user 701*a* sitting in seat 702*a* as a control center. In addition, a noise reaches low-frequency noise detection microphone 720*d*1*a* and high-frequency noise detection microphone 720*d*2*a* through noise route 710Naa of low-frequency noise and noise route 710Nba of high-frequency noise.

User's sound 701Naa emitted from user 701*a* is prevented from being detected as a noisy sound by using directivity DA in the opposite direction with respect to the control center in high-frequency noise detection microphone 720*d*2*a* and by attenuating user's sound 701Naa by disposing low-frequency noise detection microphone 720*d*1*a* in a position apart from control center 701*aa*, respectively.

Furthermore, when this device is disposed in adjacent seats, by placing a low-frequency noise detection microphone in the middle position therebetween. Thereby, an effect can be exhibited. The same is true to seat 702*b*. Also, when two seats share low-frequency noise detection microphones 720*d*1*a* and 720*d*1*b*, the same effect can be exhibited. Thus, a noise reduction device with a smaller size and a lower cost can be achieved.

Also with this example, similar to the example shown in FIG. 6, the low-frequency noise and the high-frequency noise can be detected separately. To users 701*a* and 701*b* sitting in seat 702*a* and 702*b*, a low-frequency noise and a high-frequency noise reaching the users (control centers) can be effectively reduced without being affected by user's sounds emitted from the users. Thus, the level of noise in seats 702*a* and 702*b* can be reduced with high reliability and high quality.

Next, a third application example of the embodiment of the present invention is described. FIG. 8 is a view showing a third application example of an arrangement of a noise detection microphone of this device.

Figure 8:
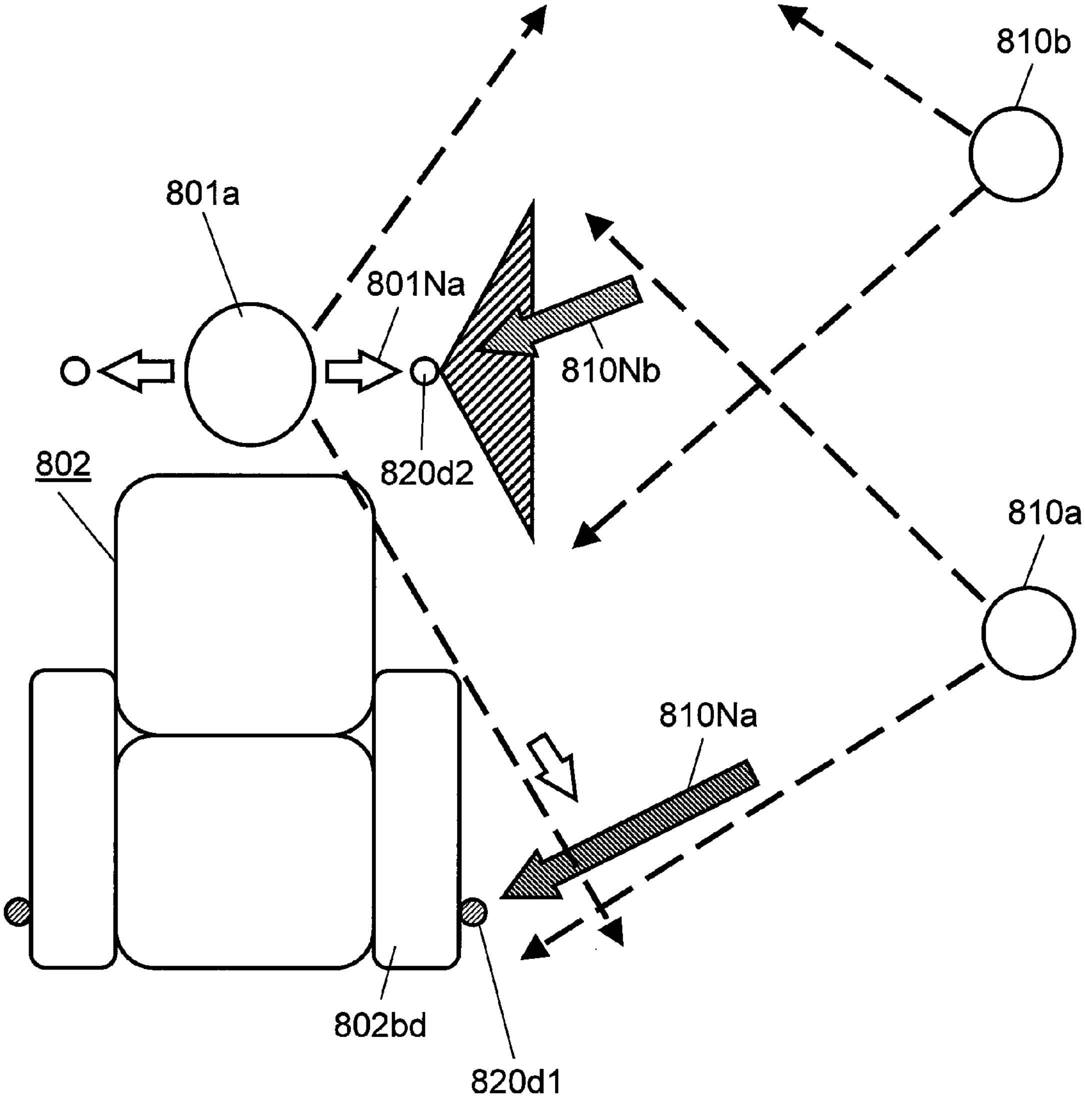
FIG. 8 is a view showing a third application example of an arrangement of a noise detection microphone of the noise reduction device in accordance with the embodiment of the present invention.

A configuration of this device shown in FIG. 8 is the same as the configuration shown in FIG. 6. User's sound 801Na propagates to the surrounding from head portion 801*a* of a user sitting in seat 802 as a control center. In addition, a noise reaches low-frequency noise detection microphone 820*d*1 and high-frequency noise detection microphone 820*d*2 through noise route 810Na of low-frequency noise and noise route 810Nb of high-frequency noise, respectively. Furthermore, low-frequency noise detection microphone 820*d*1 is disposed to control center 801*a* more distant from high-frequency noise detection microphone 820*d*2. User's sound 801Na emitted from control center 801*a* is prevented from being detected as a noisy sound by the directivity in the opposite direction with respect to the control center in high-frequency noise detection microphone 820*d*2*a* and by attenuating user's sound 801Na by disposing low-frequency noise detection microphone 820*d*1 in a position apart from control center 801*a*, respectively. The configuration of this example is characterized by the position in which low-frequency noise detection microphone 820*d*1 is placed. Low-frequency noise detection microphone 820*d*1 is disposed in the lower part of the outside of armrest 802*bd* of seat 802. User's sound 801Na emitted from a user is blocked and attenuated by armrest 802*bd* of seat 802. Therefore, user's sound 801Na is not detected as a noisy sound, so that an effect of enhancing the quality of noise reduction of this device can be exhibited.

Figure 9:
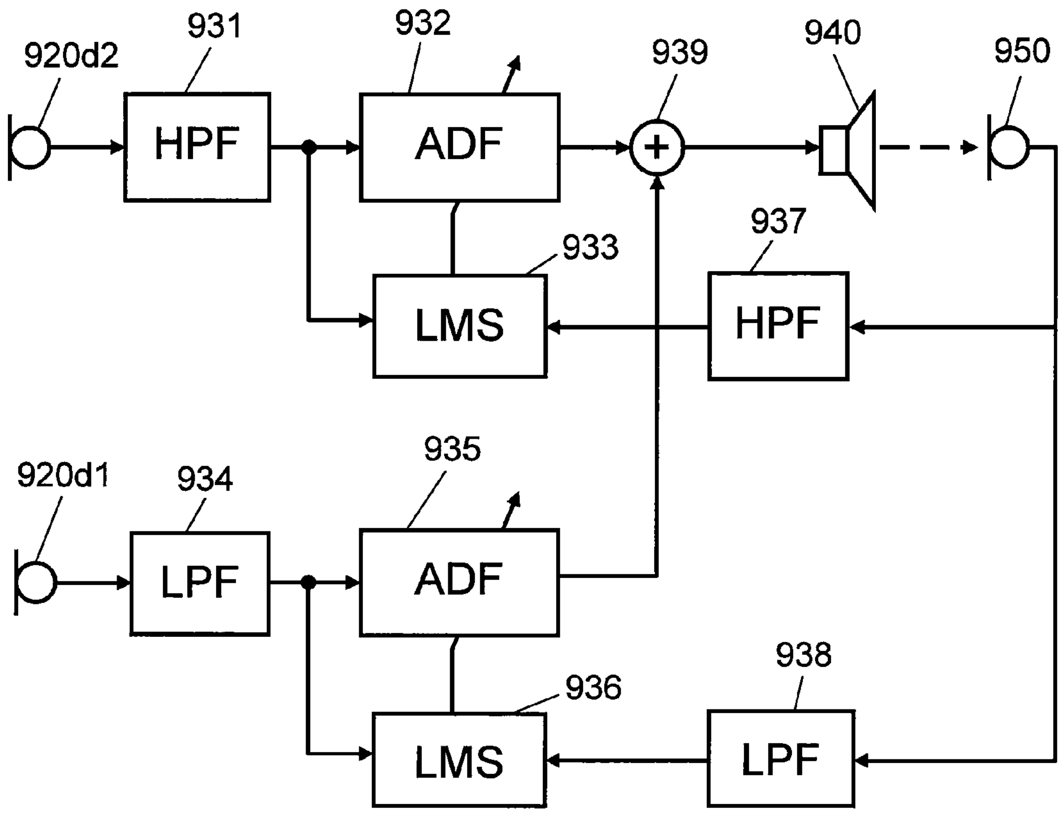
FIG. 9 is a block diagram showing a configuration mainly showing an electric circuit block of the noise reduction device in accordance with the embodiment of the present invention.

Lastly, electrical signal processing of this device is described with reference to FIG. 9 and FIG. 10. FIG. 9 is a block diagram of a configuration mainly showing an electric circuit block of this device.

In FIG. 9, a signal from high-frequency noise detection microphone 920*d*2 passes through an HPF (high pass filter) 931 that allows only a high frequency component to pass and then is input into ADF (adaptive digital filter) 932. A filter coefficient calculated in LMS operation unit 933 is set to ADF 932. A high frequency component of an output signal from error microphone 950, which is extracted by HPF 937, is input to LMS operation unit 933, and the output of HPF 931 is also input to LMS operation unit 933.

A signal from low-frequency noise detection microphone 920*d*1 passes through LPF (low pass filter) 934 that allows only a low frequency component to pass and then is input into ADF 935. To ADF 935, a filter coefficient calculated in LMS operation unit 936 is set. A low frequency component of an output signal of error microphone 950, which is extracted by LPF 938, is input to LMS operation unit 936, and the output of LPF 934 is also input to LMS operation unit 936.

Output from ADF 932 and output from ADF 935 are added by adder 939 and output to loudspeaker 940 for generating a control sound. Error microphone 950 detects a noise from a noise source at a control point and a remaining noise offset by a control sound of loudspeaker 940. LMS operation unit 933 and LMS operation unit 936 have filter coefficients of ADF 932 and ADF 935 so that the above-mentioned remaining noise is minimized.

Since the configurations of ADF 932 and ADF 935 are the same as the conventional configuration, detailed description thereof are omitted herein. The frequency band is divided into a high frequency region and a low frequency region and filter operation is carried out. Therefore, as compared with the case in which the entire frequency band is controlled by one filter, a tap length is shorter, and thus high-speed controlling can be carried out.

Figure 10:
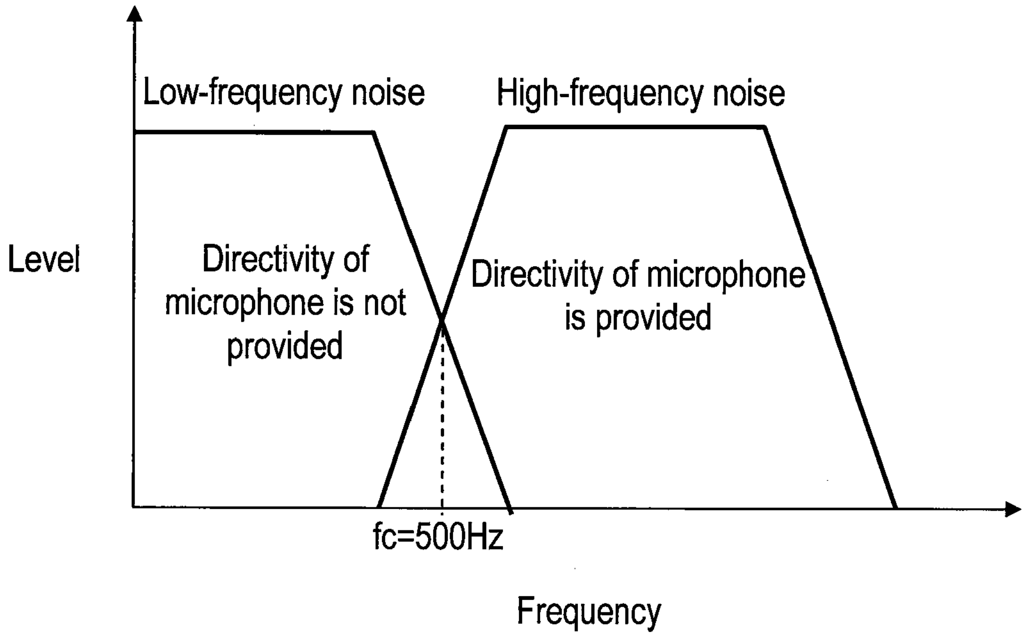
FIG. 10 is a view showing properties of HPF and LPF of the noise reduction device in accordance with the embodiment of the present invention.

FIG. 10 is a graph showing properties of LPFs 934 and 938 and HPFs 931 and 937. In FIG. 10, based on frequency fc as a boundary, a noise of frequency that is lower than fc is a low-frequency noise, and a noise of frequency that is higher than fc is a high-frequency noise.

As mentioned above, by using a noise reduction device of this embodiment, a noise detection microphone detects noises emitted from a low-frequency noise source and a high-frequency noise source effectively without detecting a voice of a user or a sound generated from a sound system as a noisy sound. Thus, a noise can be reduced effectively. Therefore, it is possible to exhibit an effect of noise reduction with high quality without having an adverse effect on user's action and convenience.

Note here that the above-mentioned embodiment describes an example in which a seat arranged in an aircraft is a control space. However, the configuration is not necessarily limited to this example. This configuration can be also used when a noise reduction device is installed in sound-insulating walls along highway, railroad, and the like.

Furthermore, in the above-mentioned embodiment, in addition to noise detector (noise source microphone) 320 as a noise detection unit for detecting a noise emitted from noise source 310, error detector (error microphone) 350 for detecting a control sound output from control sound generator (loudspeaker) 340 is provided. Error microphone 350 can detect a synthesized sound of a noise and a control sound and can correct an error of the control sound. However, in a noise reduction device in accordance with the embodiment of the present invention, error microphone 350 is not an essential element. Since error microphone 350 is generally placed in the vicinity of a head portion of a user, when error microphone 350 is omitted, a configuration of a seat in the vicinity of the head portion of a user can be simplified. Therefore, it is possible to realize a noise reduction device having an excellent convenience and a low cost without giving psychological pressure to a user.

What is claimed is:

1. A noise reduction device comprising:

a noise detection unit including a high-frequency noise detection unit and a low-frequency noise detection unit for respectively detecting a high-frequency noise and a low-frequency noise generated from a noise source;

a noise controlling unit for generating a control sound signal for cancelling a noise detected by the noise detection unit in a control center of control space; and a control sound outputting unit for outputting a control sound based on the control sound signal from the noise controlling unit, wherein the high-frequency noise detection unit is disposed in a vicinity of the control center in a state in which directivity in an opposite direction with respect to the control center is added, and the low-frequency noise detection unit is disposed in a position in which a sound emitted from the vicinity of the control center is attenuated to a predetermined level.

2. The noise reduction device of claim 1, wherein the low-frequency noise detection unit is disposed in a predetermined distance from the control center.

3. The noise reduction device of claim 1, wherein a sound-insulating wall is set in the control space, the low-frequency noise detection unit is disposed outside of the sound-insulating wall and the high-frequency noise detection unit is disposed inside the sound-insulating wall.

4. The noise reduction device of claim 1, wherein the number of the high-frequency noise detection units to be placed is larger than the number of the low-frequency noise detection units.

5. The noise reduction device of claim 1, wherein a seat disposed in a passenger vehicle is set in the control space.

6. The noise reduction device of claim 5, wherein the control center is a position of a head portion of a passenger sitting in the seat.

7. The noise reduction device of claim 5 or 6, wherein the low-frequency noise detection unit is disposed in a position at an equal distance from the control centers of two adjacent seats, and the low-frequency noise detection unit is shared by the two seats.

* * * * *